US009115441B2

(12) United States Patent
Tzou et al.

(10) Patent No.: US 9,115,441 B2
(45) Date of Patent: Aug. 25, 2015

(54) PROCESS TO MANUFACTURE SURFACE FINE GRAIN COPPER FOIL WITH HIGH PEELING STRENGTH AND ENVIRONMENTAL PROTECTION FOR PRINTED CIRCUIT BOARDS

(75) Inventors: Ming Jen Tzou, Taipei (TW); Pi Yaung Tsao, Taipei (TW); Chin Chen Huang, Taipei (TW)

(73) Assignee: NAN YA PLASTICS CORPORATION, Taipei (TW)

( * ) Notice: Subject to any disclaimer, the term of this patent is extended or adjusted under 35 U.S.C. 154(b) by 249 days.

(21) Appl. No.: 13/276,052

(22) Filed: Oct. 18, 2011

(65) Prior Publication Data

US 2013/0092548 A1 Apr. 18, 2013

(51) Int. Cl.
| | |
|---|---|
| *C25D 5/10* | (2006.01) |
| *C25D 5/34* | (2006.01) |
| *C25D 3/38* | (2006.01) |
| *C25D 7/06* | (2006.01) |
| *H05K 3/38* | (2006.01) |

(52) U.S. Cl.
CPC .. *C25D 5/34* (2013.01); *C25D 3/38* (2013.01); *C25D 5/10* (2013.01); *C25D 7/0614* (2013.01); *H05K 3/384* (2013.01)

(58) Field of Classification Search
CPC .............. C25D 3/38; C25D 5/34; C25D 7/06
USPC .......................................... 205/182, 210, 215
See application file for complete search history.

(56) References Cited

U.S. PATENT DOCUMENTS

| | | | | | |
|---|---|---|---|---|---|
| 5,366,814 | A | * | 11/1994 | Yamanishi et al. | 428/607 |
| 5,569,545 | A | * | 10/1996 | Yokono et al. | 428/626 |
| 5,792,333 | A | * | 8/1998 | Oguro et al. | 205/103 |
| 2002/0011418 | A1 | * | 1/2002 | Manabe et al. | 205/191 |
| 2010/0270164 | A1 | * | 10/2010 | Kubota | 205/50 |

FOREIGN PATENT DOCUMENTS

| | | | | | |
|---|---|---|---|---|---|
| JP | 50005988 | B | * | 3/1975 | ............ C25F 1/02 |
| JP | 52-145769 | | | 12/1977 | |
| JP | 53-39327 | | | 10/1978 | |
| JP | 54-38053 | | | 11/1979 | |
| JP | 55-58502 | | | 5/1980 | |
| JP | 58-28893 | | | 2/1983 | |
| JP | 02-292894 | | | 12/1990 | |
| JP | 02-292895 | | | 12/1990 | |
| JP | 08-236930 | | | 9/1996 | |
| JP | 11-256389 | | | 9/1999 | |
| WO | WO 2009081807 | A1 | * | 7/2009 | ............ C25D 9/08 |

* cited by examiner

*Primary Examiner* — Edna Wong
(74) *Attorney, Agent, or Firm* — Bacon & Thomas, PLLC

(57) ABSTRACT

The present invention relates to a manufacturing method for a fine grain surface copper foil with the low roughness, high peeling strength, high chemical resistance, high heat resistance, high resistance to moisture absorption and good etching properties, and applicable to all kinds of printed circuit boards. The technical characteristics are that the adhesion surface of copper foil is electroplated in an electroplating bath composed of copper sulfate, sulfuric acid, tungsten compounds to obtain a roughening treatment layer which is then treated with a electroplating copper foil method for anti-rust and thermoresistance known to the art to get a Zn alloy thermoresistant layer.

4 Claims, 2 Drawing Sheets

PROCESS TO MANUFACTURE SURFACE FINE GRAIN COPPER FOIL WITH HIGH PEELING STRENGTH AND ENVIRONMENTAL PROTECTION FOR PRINTED CIRCUIT BOARDS

FIELD OF THE INVENTION

The present invention relates to a surface fine grain copper foil applicable for printed circuit boards of various specifications, and its manufacturing method.

BACKGROUND OF THE INVENTION

On the application of copper foil in the printed circuit board, the conventional process includes the electrochemical deposition of copper sulfate electrolyte on the copper drum surface of the cathode to electroplate copper on the original foil, then through the after-treatment process to procure the ultimate goal product. The surface roughening treatment of copper foil is achieved with hot pressing or calendering metal sheet, copper or nickel, resulted copper foil is used as the base material for laminating with a high glass transition temperature (Tg) epoxy resin substrate, phenolic resin substrate, or polyimide resin substrate into a copper clad laminate (CCL) in electrical and electronic industries.

The basic feature required for surface roughening treated copper foil for printed circuit boards is excellent sufficient peeling strength between copper foil and a variety of epoxy, phenolic, or polyimide resin substrate, and peeling strength will be maintained above the standard in the hot pressing and the various follow-up treatment processes.

Therefore, besides this copper should have excellent acid or alkali chemical resistance, heat resistance and other features, in the formation of circuit patterns made of copper plate etching process, the residue should not cause the deckle edge phenomenon for the excellent etching characteristics. To enable copper foil with a variety of above-mentioned characteristics, usually at first the so-called copper surface roughening treatment is conducted, then the known post-treatment processes including heat resistant layer, rust free layer and silane coupling agent layer are followed up.

In recent years, with notebook computers, mobile phones popularity, the use of the high glass transition temperature (Tg) epoxy printed circuit substrate tends to increase year by year, as compared to the traditionally used FR-4 substrate, peeling strength between the copper foil substrate and the high Tg substrate significantly is lower. To enhance peeling strength between copper foil and the high Tg substrate, generally the surface roughness of copper foil should be improved to overcome the drawack. However, this surface roughening method can easily induce copper powder out of place (powder dropping), and abnormal copper etching residues.

On the other hand, due to high density, high performance and miniaturization trend of electronic components, the circuit of printed circuit boards tends to have high density, the circuit line width is also to the direction of miniaturization. Therefore, copper foil used in printed circuit boards also has the low roughness feature for applying to high density and fine circuit lines. However, lamination peeling strength between this low-roughness copper foil and the circuit board will deteriorate, and the above requirements for copper foil properties will not be able to reach, resulting in the occurrence of contradictory conditions.

In order to have a low roughness on the one hand, meanwhile maintaining the characteristics of copper foil for the requirements needed, in the publicly known existing technology: the Cu—Ni binary alloy system shows better heat resistant peeling strength and salt acid resistance, but it can not be etched with a alkaline etching solution, as revealed in Japanese Patent Application No-1977-145769 and Japanese Patent Application No-1980-058502; Cu—Co system as shown in Japanese Patent Application No. 1983-028893 and Japanese Patent Application No. 1990-292895 with $CuCl_2$ can also be etched in the alkaline etching solution, but heat resistance, peeling strength and salt acid resistance worse than those of Cu—Ni system; Cu—Ni—Co system of Japanese Patent Application No. 1990-292894, Japanese Patent Application No. 1996-236930 reveals a the roughening procession method with an acid copper plating solution containing chromium and tungsten metal ions and one or more metal ion chosen from vanadium, nickel, iron, cobalt, zinc and molybdenum; Japanese Patent Application No. 1999-256389 discloses a roughening procession method with an acidic electroplating solution containing a metal ion selected from molybdenum, iron, nickel or tungsten; and to overcome the poor heat resistant peeling strength, actually arsenic, antimony, bismuth or selenium and other acidic copper electrolyte solution are used for more effective copper roughening treatments (Japan Patent No. 1979-38053, Japan Patent No. 1978-39327), but arsenic, antimony, bismuth and other elements added electrolyte solution results in wastewater treatment and environmental protection problems. However, the known knowledge can only solve part of the copper foil characteristics is problems, but can not fully take into account the requirements of environmental protection and maintain the copper foil peeling strength, heat resistance, acid resistance, moisture resistance, powder dropping and etching characteristics.

BRIEF DESCRIPTION OF THE DRAWINGS

The patent or application file contains at least one drawing executed in black and while photographs. Copies of this patent or patent application publication with black and white photograph(s) will be provided by the Office upon request and payment of the necessary fee.

DETAILED DESCRIPTION OF THE INVENTION

Figure 1:
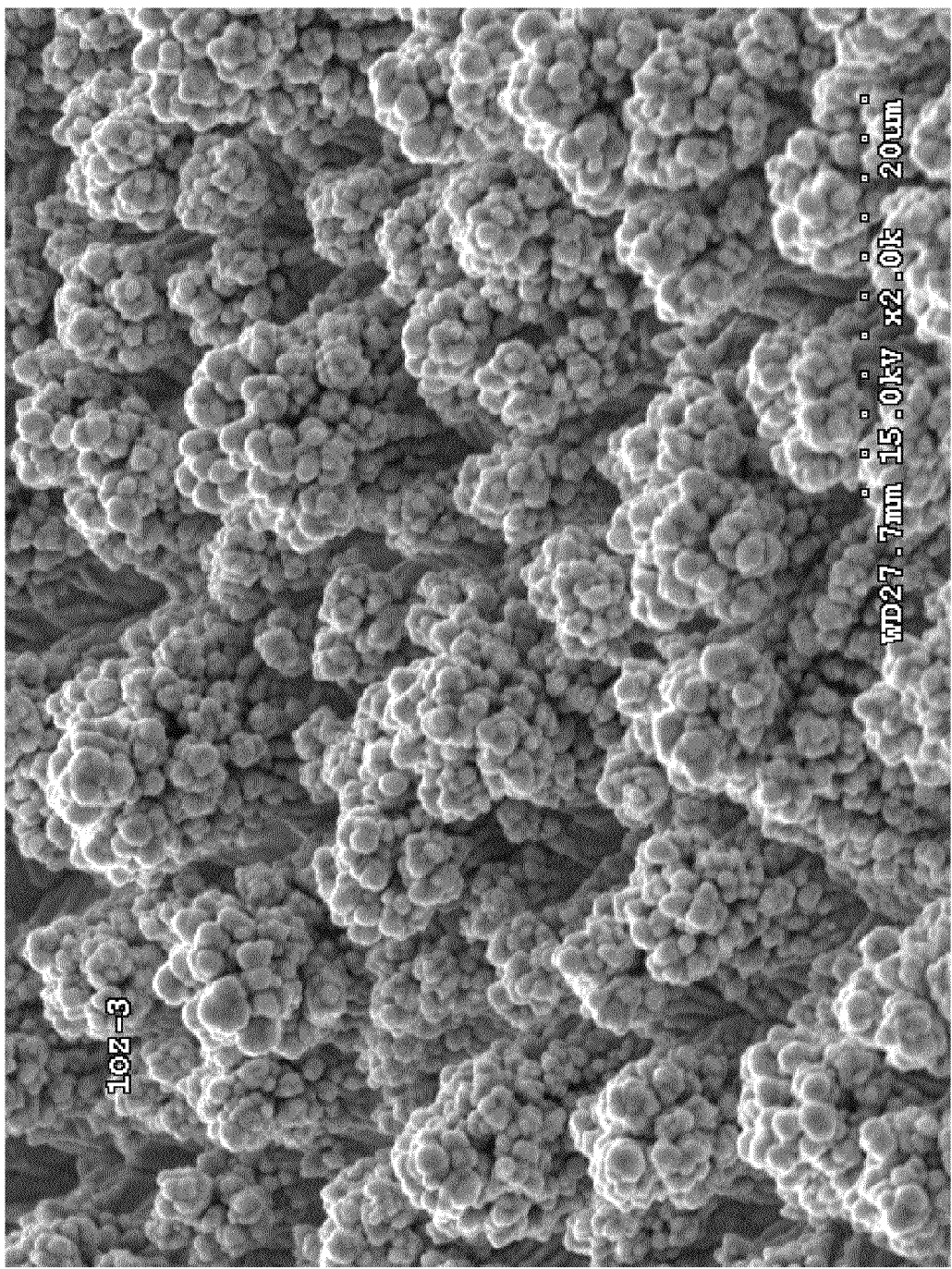
FIG. 1: The SEM (scanning electron microscope) photograph of the inventive Example 1.

In view of the above mentioned drawbacks, the purpose of the present invention is to provide copper foil for printed circuit boards, which shows a sufficient adhesion (strength) between the adhesion surface of copper foil and the synthetic resin substrate, no powder dropping phenomena in the etching process, the roughening treatment electrolyte solution and waste water from electrolysis has no environmental problems.

The present Inventors, based on many years of work experience and studies & experiments on the above issues to be solved, find that the adhesion surface of copper foil is firstly washed with acidic copper sulfate solution to remove dirt or filth attached to the surface thereof, then add a trace of tungsten ionic compound into the copper sulfate plating bath, thereby the electrodeposited copper tumor deposits on not only peaks, but also effectively and uniformly in the deep valley position, the roughening treatment of the copper foil surface to be laminated with the synthetic resin is critical to the quality of copper foil, according to this view, the present invention is completed.

The purpose of the present invention is to provide a technique to solve these known problems, by a special electrolyte solution and a special electrolysis treatment step, the copper tumor deposits on not only peaks, but also effectively and uniformly in the deep valley position of the adhesion surface of copper foil. The resulted tumors are small in size and many in quantity, particularly in the situation of low roughness, the copper foil surface possesses the properties to meet various requirements, and it is suitable to be used in all types of printed circuit boards.

To achieve the above-mentioned purpose of the invention, the inventive printed circuit board copper foil is different from the closest existing technique is the copper foil surface roughening. The treating steps are as:
1) the low roughness surface of copper foil to be laminated is first washed with a copper sulfate I sulfuric acid solution to remove dirt or filth attached on the surface of copper foil,
2) the resulted copper foil is dipped into a plating bath composed of copper sulfate, sulfuric acid, sodium phosphotungstate compounds to electrodeposit a roughening treatment layer; again a heat resistant Zn alloy layer is formed on the roughening treatment layer via a known heat resistant processing techniques; thereafter an electrolytic alkali chromium rust proof layer is added on the heat resistant layer; Finally a silane coupling agent treatment layer is coated on the rust proof layer.

According to the invention, the above mentioned special electroplating solution of acidic washing liquor is containing copper sulfate pentahydrate: 245-265 g/l and sulfuric acid: —100 g/l; the electroplating bath is containing copper sulfate pentahydrate: 80-90 g/l, sulfuric acid: 90-100 g/l, and trace sodium phosphotungstate (with molecular formula of $2Na_2O \cdot P_2O_5 \cdot 12WO_3 \cdot 18H_2O$, white powder and water-soluble, to be used as partition potassium, the uric acid reagent): 15-55 ppm to be electroplated at temperature: 20-75° C., current density: 30-45 A/dm$^2$, plating time: 3 to 5 seconds.

It should be emphasized that: if the concentration of the acidic washing liquor with copper sulfate pentahydrate 245 g/l and sulfuric acid below 90 g/l, washing effect is bad; if the concentration of the acidic washing liquor with copper sulfate pentahydrate is higher than 265 g/l, crystallization cake can be occurred so as to form the copper foil form rough and uneven in surface; if the concentration of sulfuric acid is higher 100 g/l, the phenomenon of oxidized spot will be occurred. If copper sulfate pentahydrate is below 80 g/l, the copper powder will fall down (powder dropping); if 90 g/l or more, peeling strength will be insufficient. If the concentration of sulfuric acid is below 90 g/l, the plating mass transfer becomes worse; if 100 g/l or more, the etching effect is bad. If the concentration of sodium phosphotungstate is below 15 ppm, no deep plating effect is achieved; if 55 ppm or more, copper powder falls down (powder dropping). If temperature is below 20° C., peeling strength will be insufficient; if above 75° C., copper powder falls down (powder dropping). If current density is below 30 A/dm$^2$, peeling strength will be insufficient; if above 45 A/dm$^2$, copper powder falls down (powder dropping). If plating time is 3 seconds or less, peeling strength is inadequate; if 5 seconds or more, copper powder falls down (powder dropping).

To avoid a heat discoloration, the conventional method is to deposit a Zn alloy thermal resistant layer, such as Zn—Ni, Zn—Co, Zn—Mo or Zn—Ni—Co etc., on the roughening treatment layer. The thermal resistant layer electrolyte solution composition including Zn compounds: 1-10 g/l, other metal compounds: 0.5-15 g/l, pH: 4-10, is electroplated at the temperature: 35-60° C., current density: 0.1-4 A/dm$^2$, plating time: 3-5 seconds.

After Zn alloy thermal resistant layer is formed, an alkali chromium antirust layer is electroplated thereon and finally silane is sprayed to form a coupling treatment layer. The antirust layer electrolyte solution has chromic acid concentration: 1-12 g/l, liquid caustic soda concentration: 20-45 g/l, temperature: 35-75° C., current density: 0.1-3 A/dm$^2$, plating time: 3-5 seconds to obtain better conditions for the plating performance, and the silane coupling agent treatment layer is made of spraying a 0.1 to 1.0% by weight of silane coupling agent diluted with pure water and drying on the anti-rust layer.

EXAMPLES

The present invention is described specifically in the preferred examples and the comparative examples, but the scope of the present invention is not limited therein.

Example 1

The following copper foil for electrolysis with a thickness of 30-40 μm and a surface roughness below Ra=0.82 μm is used:
(1) Firstly copper foil is washed with an acidic solution consisting of copper sulfate pentahydrate 255 g/l, sulfuric acid 95 g/l for 5 seconds;
(2) the washed copper foil is dipped in a electroplating bath composed of copper sulfate pentahydrate 86 g/l, sulfuric acid 95 g/l and sodium phosphotungstate 26 ppm at 25° C., current density of 42 A/dm$^2$ to treat the adhesion surface of copper foil for 3 seconds;
(3) after water washing, it is electroplated with a plating solution composed of copper sulfate pentahydrate 300 g/l, sulfuric acid 100 g/l at the plating bath temperature of 60° C., current density of 32.5 A/dm$^2$ for 3 seconds, to form a roughening copper layer,
(4) obtained copper foil is washed with water, then the roughening copper layer thereof is electroplated in the same plating solution as (2) at a current density of 40 A/dm$^2$ for 3 seconds to form a composite metal layer;
(5) resulted copper foil is washed with water, and the composite metal layer then is plated in the same plating solution as (3) at a current density of 36 A/dm$^2$ for 3 seconds to form a complete roughening layer (as shown in FIG. 1: wherein the copper tumor deposits on not only peaks, but also effectively and uniformly in the deep valley position.)
(6) then, copper foil is washed with water again, its roughening layer is electroplated with the use of a plating bath including zinc sulfate seven hydrate 9 g/l, nickel sulfate hexahydrate 3.5 g/l, at pH 9.5, current density of 0.5 A/dm$^2$ for 5 seconds to form a heat resistant layer;
(7) and copper foil with a heat resistant layer is washed with water again, then the heat resistant layer thereof is plated in a plating bath composed of chromic acid 1.6 g/l, liquid caustic soda 25 g/l, at a current density of 1 A/dm$^2$ for 3 seconds to form a anti-rust layer;
(8) finally, the copper foil with its anti-rust layer is washed with water, the anti-rust layer thereof is spray coated with 0.5 weight % aqueous solution of 3-glycidyl trimethyl silane and dried in 150° C. oven for 5 seconds. The characteristics of copper foil resulted from the above steps are shown in Table 2.

Example 2

Following the same steps as Example 1, except that in step (2) of Example 1: "The adhesion surface of copper foil is electroplated in a plating bath composed of copper sulfate pentahydrate 86 g/l, sulfuric acid 95 g/l and sodium phosphotungstate 26 ppm at 25° C., current density of 42 A/dm² for 3 seconds", the content of sodium phosphotungstate is 17 ppm instead of 26 ppm, the others are the same as Example 1. The characteristics of copper foil obtained from the above steps are shown in Table 2.

Example 3

Replicating Example 1, but in step (2) of Example 1: "The adhesion surface of copper foil is electroplated in a plating bath composed of copper sulfate pentahydrate 86 g/l, sulfuric acid 95 g/l and sodium phosphotungstate 26 ppm at 25° C., current density of 42 A/dm² for 3 seconds", the content of sodium phosphotungstate is 52 ppm instead of 26 ppm, the others are the same as Example 1. The characteristics of copper foil obtained from the above steps are shown in Table 2.

Example 4

Repeating Example 1, the only difference is that in step(2) of Example 1: "The adhesion surface of copper foil is electroplated in a plating bath composed of copper sulfate pentahydrate 86 g/l, sulfuric acid 95 g/l and sodium phosphotungstate 26 ppm at 25° C., current density of 42 A/dm² for 3 seconds", the concentration of sulfuric acid is 100 g/l instead of 95 g/l, the others are the same as Example 1. The characteristics of copper foil obtained from the above steps are shown in Table 2.

Example 5

Repeating embodiment 1, but in step (2) of Example 1: "The adhesion surface of copper foil is electroplated in a plating bath composed of copper sulfate pentahydrate 86 g/l, sulfuric acid 95 g/l and sodium phosphotungstate 26 ppm at 25° C., current density of 42 A/dm² for 3 seconds", the concentration of sulfuric acid is 90 g/l instead of 95 g/l and the content of sodium phosphotungstate is 17 ppm instead of 26 ppm, the others are the same as Example 1. The characteristics of copper foil obtained from the above steps are shown in Table 2.

Comparative Example 1

Figure 2:
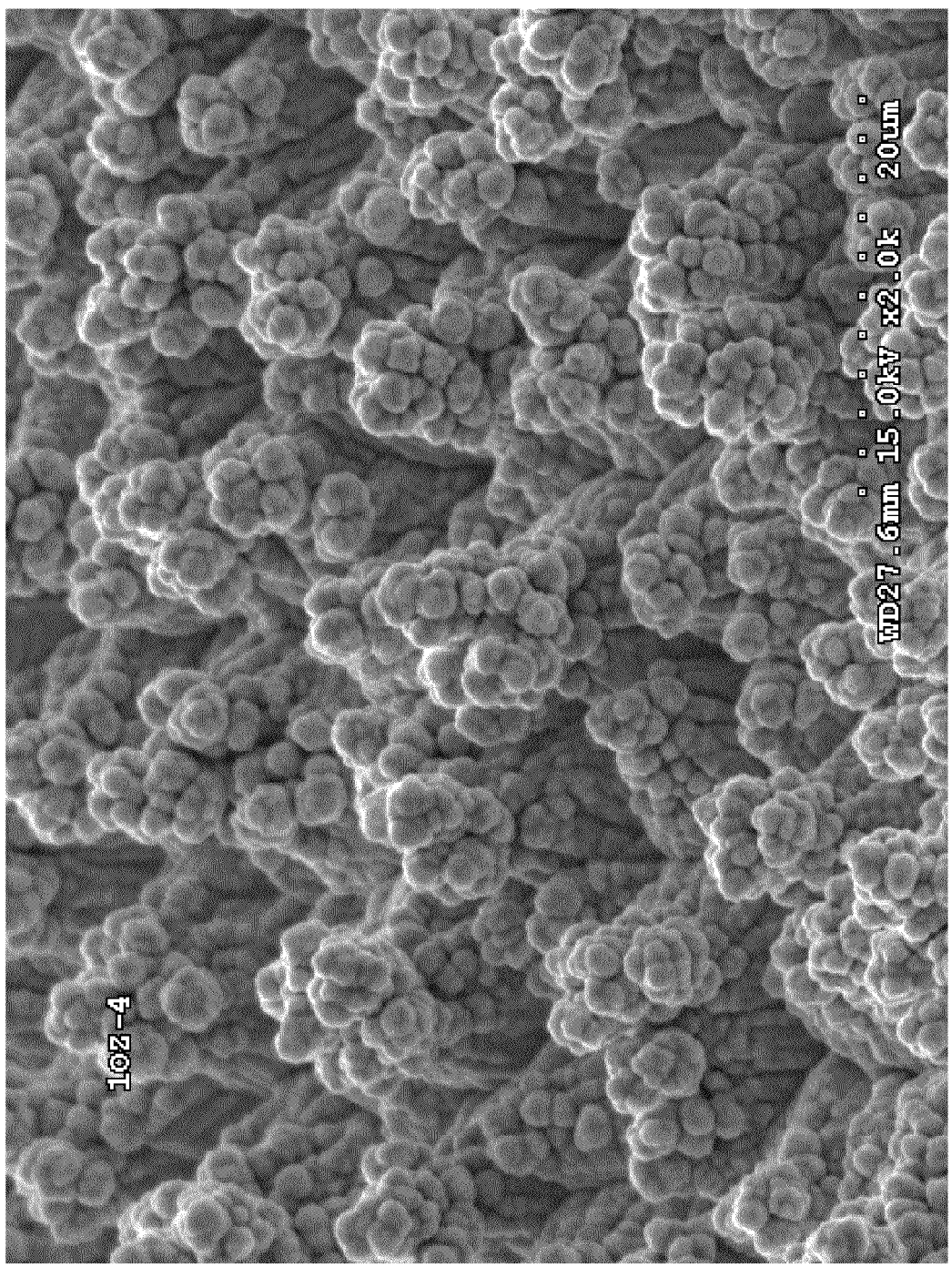
FIG. 2: The SEM (scanning electron microscope) photograph of the Comparative Example 1.

1) Repeating Example 1, but in step (2) of Example 1: "The adhesion surface of copper foil is electroplated in a plating bath composed of copper sulfate pentahydrate 86 g/l, sulfuric acid 95 g/l and sodium phosphotungstate 26 ppm at 25° C., current density of 40 A/dm² for 3 seconds", the concentration of sulfuric acid is 90 g/l instead of 95 g/l and 528 ppm of arsenic trioxide is used instead of 26 ppm of sodium phosphotungstate, the others are the same as Example 1;
2) the adhesion surface of copper foil described in step 1) above is electroplated in a plating bath consisting of copper sulfate pentahydrate 255 g/l, sulfuric acid 95 g/l at 55° C. temperature, 39.5 A/dm² current density for 3 seconds to form a copper roughening layer;
3) the resulted copper roughening layer is washed with water, and then again electroplated in the same plating solution as in step 1), at a current density of 31.5 A/dm² for 3 seconds to form a composite metal layer;
4) finally, copper foil is washed with water again, the composite metal layer thereof is electroplated in the same plating solution as in step 2) at a current density of 40.6 A/dm² for 3 seconds to form a complete roughening layer (see FIG. 2; the figure shows that the copper tumor only on the peak without the deep-plating effect), the characteristics of copper foil obtained from the above steps are shown in Table 2.

Comparative Example 2

Comparative Example 1 is repeated, but the concentration of arsenic trioxide changes from 528 ppm to 396 ppm, the others are the same as Comparative Example 1. The characteristics of copper foil obtained from the above steps are shown in Table 2.

Comparative Example 3

Comparative Example 1 is repeated, but the concentration of arsenic trioxide is changed from 528 ppm to 132 ppm, the others are the same as Comparative Example 1. The characteristics of copper foil obtained from the above steps are shown in Table 2.

Comparative Example 4

Comparative Example 1 is repeated, but the concentration of arsenic trioxide is changed from 528 ppm to 66 ppm, the others are the same as Comparative Example 1. The characteristics of copper foil obtained from the above steps are shown in Table 2.

In the examples and the comparative examples, the test items of the physical properties are:
1) Peeling Strength:
   NP-180 (a halogen resin made by Nan Ya Plastics Corporation) substrate and the non-smooth surface of copper foil are laminated into a 32 mil-wide lamination test specimen, peeling strength is measured with a tensile machine.
2) Heat Resistant Peeling Strength:
   The test specimens are placed in the oven and baked at 177° C. for 240 hours, then Peeling strength thereof is determined.
3) Resistance to HCl
   The test specimens are dipped in 18% HCl solution for 1 hour, then the peeling strength deterioration rate is measured.
4) Moisture Absorption Resistance:
   The test specimens are put into an autoclave at 1 atm, temperature 121° C. for 2 hours, then the peeling strength deterioration rate is measured.
5) Powder Dropping:
   The rough side of the filter paper is pressed on the non-smooth surface of copper foil by fingertips at the left position of the full width thereof, the filter paper slides from left to right for a distance of about 30 cm, after finishing the test, the resulted filter paper is compared with the sample card to determine grades.
   <Evaluation Criteria of Powder Dropping Grades>
   O=grade 0-1
   Δ≤grade 1-2
   X≤grade 2

6) Etching Properties:

The test specimens with line width/line space: 75/75 (μm) are prepared, and dipped into an acidic etching solution consisting of copper chloride 265.9 g/l, hydrogen peroxide 150 ml/l, HCl 224 ml/l, at the temperature of 55° C. for 5 minutes, then soaked in 3% NaOH solution at the temperature of 48° C. to peel off the film. After water washing, the resulted test specimens are electroplated with nickel, and then sliced for OM (optical microscope) and SEM (scanning electron microscope) observations to check flash phenomenon.

<Evaluation Criteria of Etching Properties>

O: after etching, the substrate shows no residual flash phenomenon.

Δ: after etching, the substrate shows some residual flash phenomena.

ΔX: after etching, the substrate shows a lot of residual flash phenomena.

TABLE 1

The electroplating solution composition of the inventive examples and the comarative examples

| Items | copper sulfate pentahydrate (g/L) | sulfuric acid (g/L) | sodium phosphotungstate (ppm) | arsenic trioxide (ppm) |
|---|---|---|---|---|
| Example 1 | 86 | 95 | 26 | — |
| Example 2 | 86 | 95 | 17 | — |
| Example 3 | 86 | 95 | 52 | — |
| Example 4 | 86 | 100 | 26 | — |
| Example 5 | 86 | 90 | 17 | — |
| Comarative Example 1 | 86 | 90 | — | 528 |
| Comarative Example 2 | 86 | 90 | — | 396 |
| Comarative Example 3 | 86 | 90 | — | 132 |
| Comarative Example 4 | 86 | 90 | — | 66 |

[Efficacy of Invention]

As shown in Table 2, peeling strength, heat resistant peeling strength, HCl resistance, moisture absorption resistance characteristics of the inventive Examples1-5 are very good, although the non-smooth surface roughness of the inventive Examples 1 to 5 is lower as compared with comparative Examples 1 to 4, powder dropping and etching properties are also quite good. Based on the comparison, the characteristics of the comparative examples are worse than those of the present invention. For example, peeling strength, heat resistant peeling strength, HCl resistance, moisture absorption resistance and other qualities are about 11.7%, 52.4%, 26.3%, 11.6% or more respectively better than those of the comparative examples.

As mentioned above, the fine grain surface copper foil made from the manufacturing method in the Examples of present invention shows a lower roughness of the non-smooth surface than the comparative examples, but it still has high peeling strength, high heat resistant peeling strength, HCl resistance, high moisture absorption resistance, low powder dropping and better etching characteristics, suitable for the applications of a variety of printed circuit boards. No toxic element such as arsenic, etc. is used in the surface roughening; meanwhile the electroplating shows a short plating time, high efficiency, and the advantages of both the environmental protection and the high speed.

We claim:

1. A process to manufacture fine grain surface copper foil for being favorable for environmental protection as well as high peeling strength of the same used for printed circuit boards, consisting of the steps of:

(1) washing an adhering surface of a copper foil through an acidic washing, said acidic washing being a solution consisting of copper sulfate pentahydrate having a concentration between about 245-265 g/l and sulfuric acid having a concentration between about 90-100 g/l;

(2) electroplating the washed adhering surface of the copper foil to form a roughening treatment layer by subjecting said washed adhering surface of the copper foil to an

TABLE 2

The physical characteristics of of the inventive examples and the comparative examples The experimental results of the physical characteristics

| Items | | M/S Roughness (Ra/Rz) (μm) | Peeling strength (kgf/cm) | Heat resistant peeling strength (kgf/cm) | Resistance to HCl (%) | Moisture absorption resistance (PCT-2/121, %) | Powder dropping | Etching properties |
|---|---|---|---|---|---|---|---|---|
| Examples | 1 | 1.33/7.96 | 1.72 | 0.67 | 8.3 | 18.5 | O | O |
| | 2 | 1.31/7.96 | 1.72 | 0.64 | 8.1 | 18.2 | O | O |
| | 3 | 1.33/8.01 | 1.74 | 0.67 | 8.5 | 17.9 | O | O |
| | 4 | 1.29/7.83 | 1.72 | 0.68 | 8.3 | 18.1 | O | O |
| | 5 | 1.30/7.90 | 1.75 | 0.70 | 8.0 | 18.3 | O | O |
| Comarative Examples | 1 | 1.53/9.11 | 1.54 | 0.42 | 35.6 | 30.1 | O | Δ |
| | 2 | 1.57/9.82 | 1.54 | 0.40 | 34.8 | 30.3 | O | Δ |
| | 3 | 1.59/9.51 | 1.37 | 0.23 | 43.8 | 36.8 | | |
| | 4 | 1.70/10.58 | 1.35 | 0.19 | 45.3 | 37.2 | | |

Note:
1. M/S: the non-smooth surface of copper foil.
2. Ra: the centerline average roughness.
3. Rz: the average roughness of ten points.

electroplating treatment using a plating solution consisting of copper sulfate pentahydrate having a concentration exceeding 80 g/l and less than 90 g/l, sulfuric acid having a concentration of between about 90-100 g/l and trace sodium phosphotungstate between about 15-55 ppm;

(3) washing the copper foil of step (2) with water, and electroplating the roughening treatment layer of the copper foil to form a roughening copper layer by subjecting said copper foil to an electroplating treatment using a plating solution consisting of copper sulfate pentahydrate having a concentration of 300 g/l and sulfuric acid having a concentration of 100 g/l;

(4) washing the copper foil of step (3) with water and electroplating the roughening copper layer of the copper foil to form a composite metal layer by subjecting said roughening copper layer of the copper foil to an electroplating treatment through using the same plating solution as used in step (2); and (5) washing the copper foil of step (4) with water and electroplating the composite metal layer of the copper foil to form a complete roughening layer by subjecting the composite metal layer of the copper foil to an electroplating treatment through using the same plating solution as used in step (3).

2. The process to manufacture fine grain surface copper foil of claim 1, wherein the copper foil has a thickness of 30-40 µm and a fine grain surface roughness of Ra=0.82 µm.

3. The process to manufacture fine grain surface the copper foil of claim 1, wherein the roughening treatment layer of the copper foil of step (2) is electroplated under conditions of plating solution temperature of 20-75° C., current density of 30-45 A/dm$^2$ and plating time of 3-5 seconds.

4. The process to manufacture fine grain surface the copper foil of claim 1, wherein the roughening copper layer of the copper foil of step (3) is electroplated under conditions of plating solution temperature of 60° C., current density of 30-45 A/dm$^2$ and plating time of 3-5 seconds.

* * * * *